United States Patent [19]

Sivasothy et al.

[11] Patent Number: 4,644,186
[45] Date of Patent: Feb. 17, 1987

[54] FAST SWITCHING CIRCUIT FOR LATERAL PNP TRANSISTORS

[75] Inventors: Sivakumar Sivasothy, Mountain View; Ramanatha V. Balakrishnan, San Jose, both of Calif.

[73] Assignee: National Semiconductor Corporation, Santa Clara, Calif.

[21] Appl. No.: 642,615

[22] Filed: Aug. 20, 1984

[51] Int. Cl.$^4$ .................. H03K 19/092; H03K 19/01
[52] U.S. Cl. ................................. 307/300; 307/475; 307/270; 307/557
[58] Field of Search ............... 307/246, 270, 280, 300, 307/464, 253, 475, 557

[56] References Cited

U.S. PATENT DOCUMENTS

| | | | |
|---|---|---|---|
| 4,318,011 | 3/1982 | Zeis | 307/300 |
| 4,404,478 | 9/1983 | Rischmuller | 307/300 |
| 4,533,839 | 8/1985 | Balakrishnan | 307/270 |

Primary Examiner—Stanley D. Miller
Assistant Examiner—Richard Roseen
Attorney, Agent, or Firm—Gail W. Woodward

[57] ABSTRACT

A circuit (100) is shown which provides a large turn-on current drive to the base of a lateral PNP transistor (218) by forcing a large voltage drop across the base-emitter junction of the lateral PNP transistor in order to quickly turn on the PNP transistor. A current sensing circuit (203, 166) determines when the collector current in the PNP transistor is sufficient for proper operation of the rest of the circuitry dependent upon this PNP transistor. The current sensing circuitry then limits the base drive applied to the PNP transistor to the current level necessary to maintain the required quiescent collector current in the PNP transistor. In addition, means (190, 200) are provided to quickly clamp the base of the PNP transistor to the emitter of the PNP transistor thereby quickly turning off the PNP transistor.

6 Claims, 12 Drawing Figures

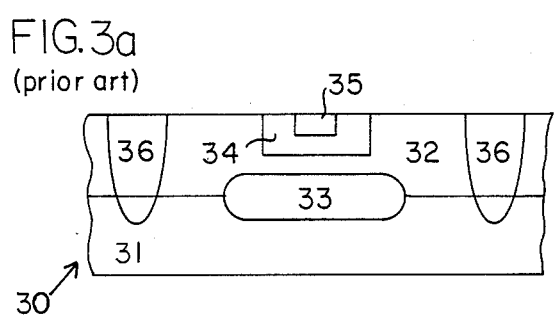
FIG. 1
(prior art)
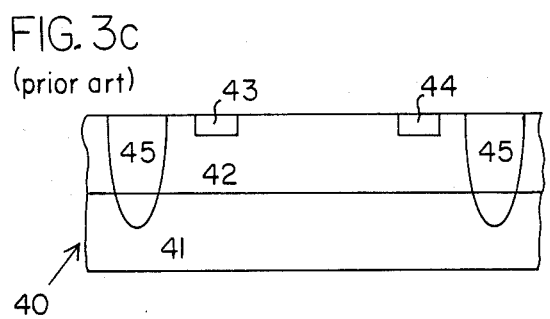
FIG. 2
(prior art)
FIG. 3a
(prior art)
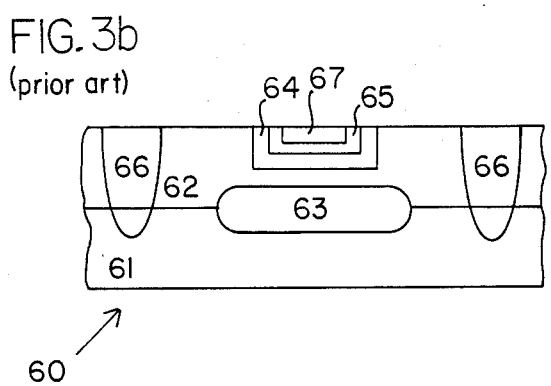
FIG. 3c
(prior art)
FIG. 3b
(prior art)
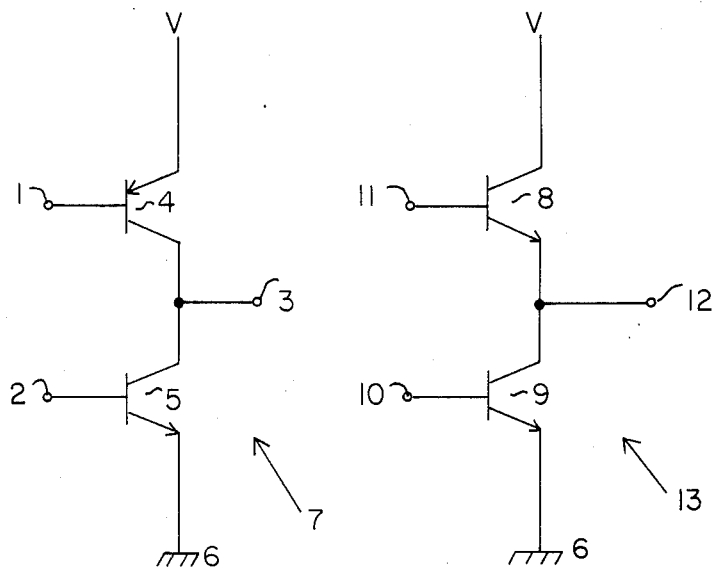
FIG. 4a (Prior art)
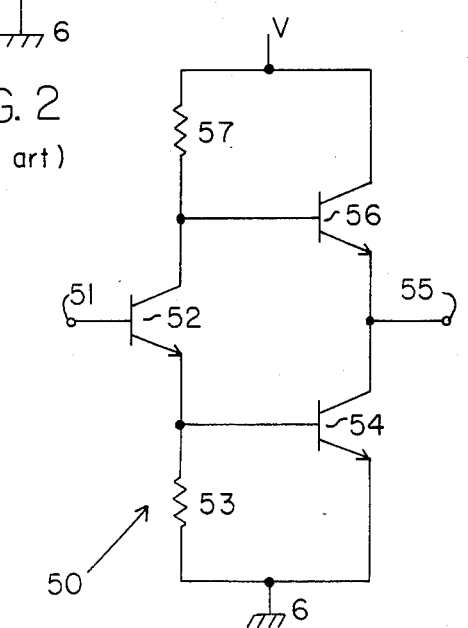
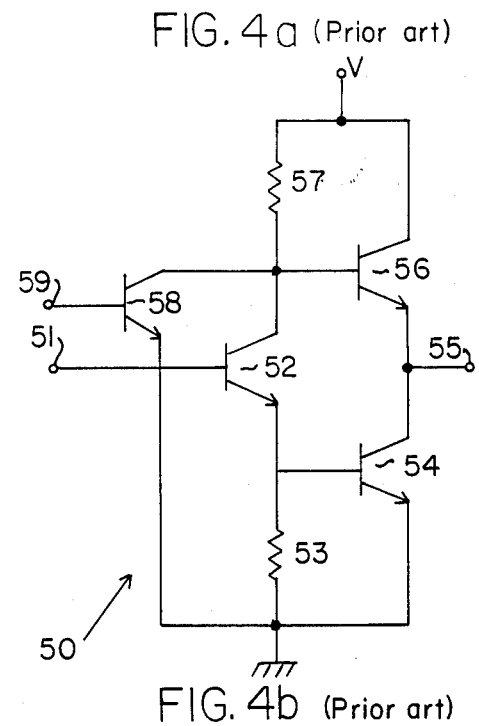
FIG. 4b (Prior art)

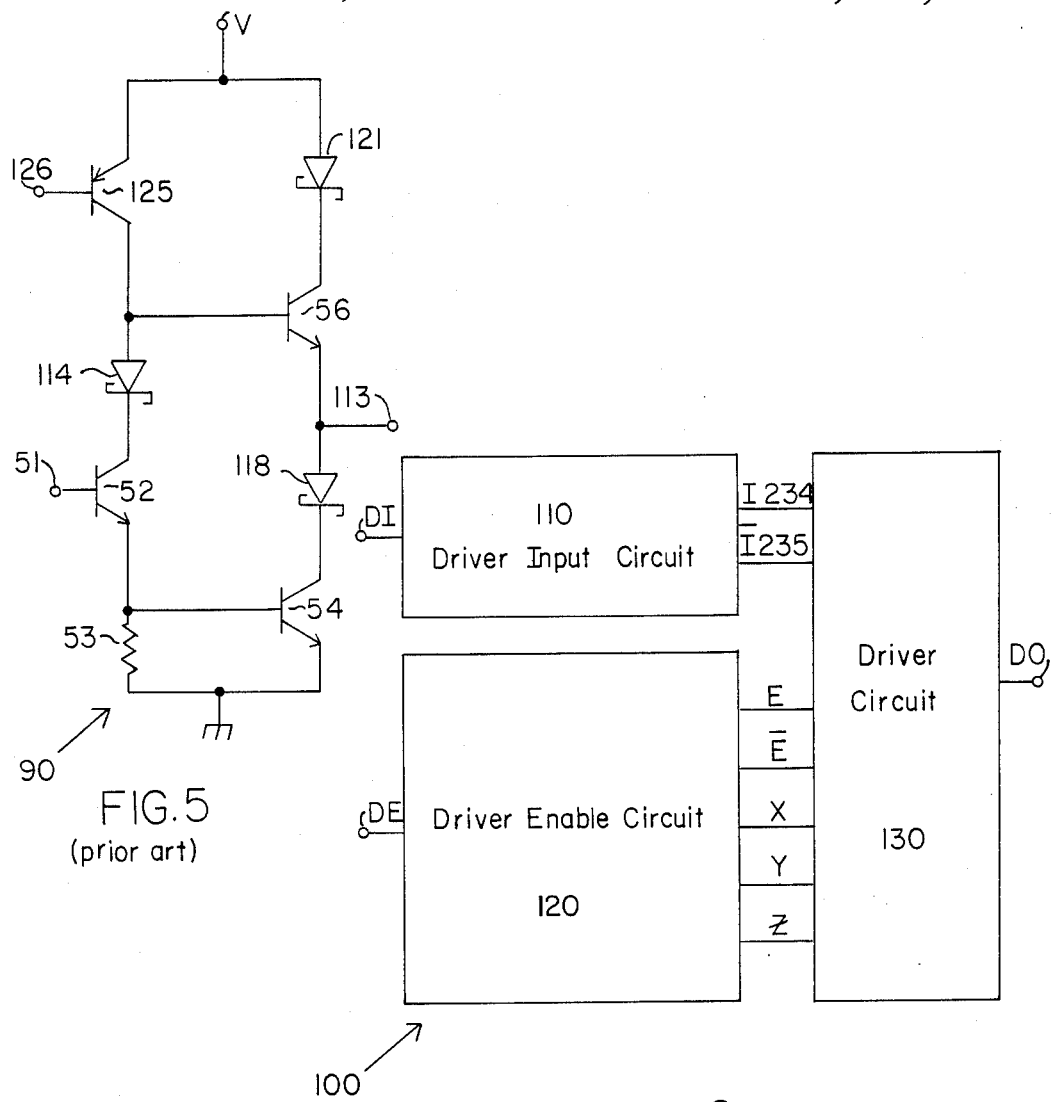
FIG. 5
(prior art)
FIG. 6
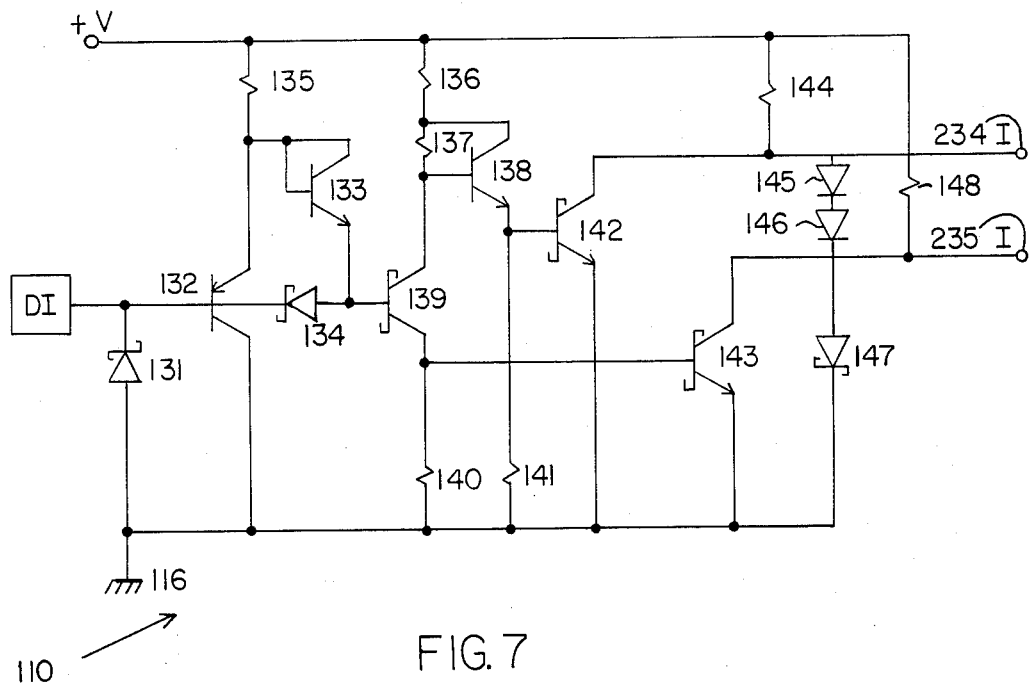
FIG. 7

FAST SWITCHING CIRCUIT FOR LATERAL PNP TRANSISTORS

BACKGROUND OF THE INVENTION

This invention relates to the output buffer stages of integrated circuits. More specifically, this invention relates to so-called "triple state" output buffers. A triple state output buffer has three potential states relative to its output terminal. Those states are logical 1 (i.e., providing current when the output terminal voltage is above the logical 1 voltage level), logical 0 (i.e., drawing current when the output terminal voltage is below the logical 0 voltage level), and high impedance (i.e., neither sourcing or sinking current thereby allowing the output terminal voltage to be determined by external circuitry). In addition, this invention relates to triple state output buffers which are capable of maintaining the high impedance output state when the output terminal of the buffer is connected to a data bus which may have a wide range of voltage levels above and below the supply voltage levels.

FIG. 1 is a schematic diagram of a simple prior art output buffer capable of functioning as a triple state output buffer. Transistor 4 is a PNP bipolar pull-up transistor. Transistor 5 is an NPN bipolar pull-down transistor. When the input signal on terminal 1 is a logical 0 (approximately 0 volts) and the input signal on terminal 2 is a logical 0, transistor 4 is on and transistor 5 is off, thereby connecting output terminal 3 to positive voltage source V and providing a logical 1 output signal (approximately 5 volts). Conversely, when the input signal on terminal 1 is a logical 1 and the input signal on terminal 2 is a logical 1, transistor 4 is off and transistor 5 is on, thereby connecting output terminal 3 to ground 6, thereby providing a logical 0 output signal. When the input signal on terminal 1 is a logical 1 and the input signal on terminal 2 is a logical 0, transistor 4 is off and transistor 5 is off and output terminal 3 has a high impedance output state, which means a high impedance exists between output terminal 3 and positive voltage source V and between output terminal 3 and ground 6. The output buffer in FIG. 1 is undesirable because it requires the use of a PNP transistor. For the purposes of output buffering PNP transistors have two significant problems:

(1) PNP transistors rely on holes as majority carriers and are therefore slower than NPN transistors which rely on electrons as majority carriers (electrons have a higher mobility than holes), and (2) it is difficult to construct an integrated circuit including vertical NPN transistors and vertical PNP transistors; therefore, slower lateral PNP transistors must be used. These problems cannot be solved using instead vertical PNP transistors and lateral NPN transistors because, as explained below, both lateral NPN and PNP transistors must have a large base region, thereby reducing the speed of the lateral transistor and the circuit containing that lateral transistor.

FIG. 2 is a schematic diagram of a simple prior art output buffer capable of functioning as a triple state output buffer which uses only NPN transistors. Transistor 8 is a NPN bipolar pull-up transistor. Transistor 9 is an NPN bipolar pull-down transistor. When the input signal on terminal 11 is a logical 1 and the input signal on terminal 10 is a logical 0, transistor 8 is on and transistor 9 is off, thereby connecting output terminal 12 to positive voltage source V and providing a logical 1 output signal. Conversely, when the signal on input terminal 11 is a logical 0 and the signal on input terminal 10 is a logical 1, transistor 8 is off and transistor 9 is on, thereby connecting output terminal 12 to ground 6, and providing a logical 0 output signal. When the signal on input terminal 11 is a logical 0 and the signal on input terminal 10 is a logical 0, transistors 8 and 9 are off and output terminal 12 has a high impedance output state, which means a high impedance exists between output terminal 12 and positive voltage source V and between output terminal 3 and ground 6. Buffer 13 is undesirable if output terminal 12 is to be connected to a bus (not shown) which may have a voltage level more negative than a logical 0 voltage level, because when buffer 13 has a high impedance output state and the voltage level of output terminal 12 goes below the voltage corresponding to a logical 0 signal, output terminal 12 is clamped to a voltage level of one base to emitter voltage drop (about 0.7 volts) below the logical 0 level on the base of transistor 8. Thus, buffer 13 sources current, contrary to its intended high impedance state.

FIG. 3a is a cross-sectional diagram of one method of constructing a vertical NPN transistor. Vertical NPN transistor 30 includes an emitter region 35, base region 34, and a collector which is formed by the combination of regions 33 and 32. Region 32 is an epitaxial layer of N type material formed upon P type substrate 31. Region 33 is a buried diffusion of N+ type material. Region 36 is an isolation diffusion made of P type material which isolates transistor 30 from other components (not shown) constructed in epitaxial layer 32. In order to provide vertical PNP transistors in an integrated circuit where N type transistors are constructed as shown in FIG. 3a, another masking and diffusion step must be performed in order to form a P region 67 in N region 35 (as shown in FIG. 3b). Vertical PNP transistor 60 in FIG. 3b includes base region 65, emitter region 67, and collector region 64. Another masking and diffusion step in the process is undesirable because each diffusion step creates additional expense in the manufacture of the integrated circuit. More importantly, if a P type diffusion is added to create a vertical PNP transistor, the concentrations of the N type diffusions will have to be modified; this results in substandard NPN devices. In order to avoid the additional masking and diffusion step and the accompanying performance degradation, it becomes necessary to use a lateral PNP transistor.

FIG. 3c is a cross-sectional diagram of a lateral PNP transistor 40. Region 41 is a P type substrate, and region 42 is an N type epitaxial layer formed on P type substrate 41. N type epitaxial layer 42 functions as the base region for lateral PNP transistor 40. Regions 43 and 44 are P type diffusion areas formed in N type epitaxial layer 42; these regions form the collector and emitter, respectively, of lateral PNP transistor 40. Region 45 is a P type isolation region which isolates lateral PNP transistor 40 from other components (not shown) formed in epitaxial layer 42. Collector 43 and emitter 44 must be spaced apart in order for the lateral PNP transistor 40 to function. In order to compensate for the inaccuracies of integrated circuit fabrication caused by photolithographic inaccuracies and lateral diffusion of dopants, collector 43 and emitter 44 must be spaced relatively far apart (approximately 6.5 microns) to avoid having collector 43 and emitter 44 run together during the diffusion process. Lateral PNP transistors are relatively slow due to the relatively large base region created by the wide spacing between collector 43 and emitter 44, and due to the low mobility of holes, which serve as the majority carriers in a PNP transistor.

FIG. 4a is a schematic diagram of an output buffer containing NPN pull-up transistor 56 and NPN pull-down transistor 54. When input terminal 51 receives a logical 1 input signal, transistor 52 is forward biased and is therefore on, and current flows from positive voltage source V through resistor 57 and transistor 52 into the base of transistor 54, thereby turning on transistor 54. Transistor 54 thus provides a low impedance path between output terminal 55 and ground 6. Therefore, the output signal of output buffer 50 is a logical 0 in response to a logical 1 input signal received on input terminal 51. Conversely, when the input signal on terminal 51 is a logical 0, transistor 52 is turned off. Therefore, the current provided by resistor 57 flows into the base of transistor 56 and thus forward biases transistor 56, and transistor 56 turns on and provides a low impedance path between positive voltage source V and output terminal 55. Simultaneously, resistor 53 pulls down the base of transistor 54, thus keeping transistor 54 turned off. Thus, the output signal from output buffer 50 is logical 1 in response to a logical 0 input signal. However, circuit 50 is undesirable in that it provides only two output states—logical 1 and logical 0, and is incapable of operating as a triple state output buffer, which is capable of providing a high impedance output signal on its output terminal.

To operate output buffer 50 as a triple state output buffer, NPN transistor 58 is added as shown in FIG. 4b. The high impedance output state is achieved by providing a logical 0 on terminal 51 and a logical 1 on terminal 59. The logical 0 on terminal 51 turns off transistors 52 and 54 as explained earlier. The logical 1 on terminal 59 causes transistor 58 to turn on and pull down the base of transistor 56 so that transistor 56 is turned off. The output signal on output terminal 55 is thus a high impedance state because both transistors 54 and 56 are turned off. The disadvantage with this output buffer circuit is that the high impedance state is maintained over a very narrow output voltage range; if the voltage on output terminal 55 is below ground voltage, transistor 56 turns on and causes output terminal 55 to clamp at a voltage equal to one base-emitter voltage drop below the base voltage of transistor 56.

FIG. 5 is a schematic diagram of an output buffer circuit similar to the output buffer circuit in FIG. 4a, except that circuit 90 includes input terminal 126, PNP transistor 125, Schottky diode 121, Schottky diode 114, and Schottky diode 118. Circuit 90 in FIG. 5 is designed to provide three logical states (logical 1, logical 0, and high impedance) over a wide voltage range on output terminal 113. When the input signal on input terminal 126 is pulled low, transistor 125 is on and therefore functions as a current source much the same as resistor 57 in FIG. 4a. Therefore, when the input signal to input terminal 126 is a logical 0, circuit 90 in FIG. 5 functions in the same manner as circuit 50 in FIG. 4a as explained above. When the input signal to input terminal 126 is a logical 1, transistor 125 is off and therefore no current is supplied to bias either transistors 54 or transistor 56. Therefore, transistors 56 and 54 provide high impedance paths from output terminal 113 to voltage source V and ground 6, respectively. Circuit 90 is designed to be in the high impedance state when the input signal on input terminal 126 is a logical 1, and to maintain this high impedance state over large swings of voltages applied to output terminal 113 (as much as +12 volts above ground and as low as −7 volts below ground 6). Diode 121 is included to prevent current flow from the emitter of transistor 56 (as a result of junction breakdown) to the collector of transistor 56 and then to the voltage source V, when transistor 56 is on and the voltage applied to output terminal 113 is greater than V. Diodes 114 and 118 are included to prevent current flow from the collectors of transistors 52 and 54, respectively, when the voltage on output terminal 113 is below ground. When NPN transistors 52, 54 and 56 are constructed as in FIG. 3a, substrate 31 in FIG. 3a is connected to ground. When a voltage below ground is applied to collector 33, the PN junction between regions 31 and 33 is forward biased. Therefore, if diodes 114 and 118 were not included in circuit 90 (FIG. 5), when the voltage on output terminal 113 became more negative than ground, current would flow from the substrate through the collectors of transistors 52 and 54, and the voltage on output terminal 113 would be clamped to a voltage level equal to one diode voltage drop below ground, when output terminal 113 should be in the high impedance state. Circuit 90 is limited in operational speed by the fact that PNP transistor 125 must be a lateral PNP transistor, for reasons explained earlier. Lateral PNP transistor 125 slows the transition from an enable state to a disable state and vice versa.

SUMMARY

In accordance with one embodiment of this invention, a circuit is shown which provides a large turn-on current drive to the base of a lateral PNP transistor by forcing a large voltage drop across the base-emitter junction of the lateral PNP transistor in order to quickly turn on the PNP transistor. A current sensing circuit determines when the collector current in the PNP transistor is sufficient for proper operation of the rest of the circuitry dependent upon this PNP transistor. The current sensing circuitry then limits the base drive applied to the PNP transistor to the current level necessary to maintain the required quiescent collector current in the PNP transistor. In addition, means are provided to quickly clamp the base of the PNP transistor to the emitter of the PNP transistor thereby quickly turning off the PNP transistor.

BRIEF DESCRIPTION OF THE DRAWING

FIG. 1 is a schematic diagram of an output buffer circuit capable of functioning as a triple state output buffer;

FIG. 2 is a schematic diagram of a triple state output buffer using only NPN transistors;

FIG. 3a is a cross-sectional diagram of a vertical NPN transistor having a buried collector diffusion;

FIG. 3b is a cross-sectional diagram of a vertical PNP transistor;

FIG. 3c is a cross-sectional diagram of a lateral PNP transistor;

FIGS. 4a and 4b are schematic diagrams of output buffer circuits containing an NPN pull-up and an NPN pull-down transistor, but containing no PNP transistors;

FIG. 5 is a schematic diagram of a triple state output buffer circuit which includes a PNP transistor for providing base drive current to the output transistors;

FIG. 6 is a block diagram of a circuit constructed in accordance with one embodiment of this invention;

FIG. 7 is a schematic diagram of one embodiment of circuit 110 in FIG. 6;

DETAILED DESCRIPTION

Figure 8:
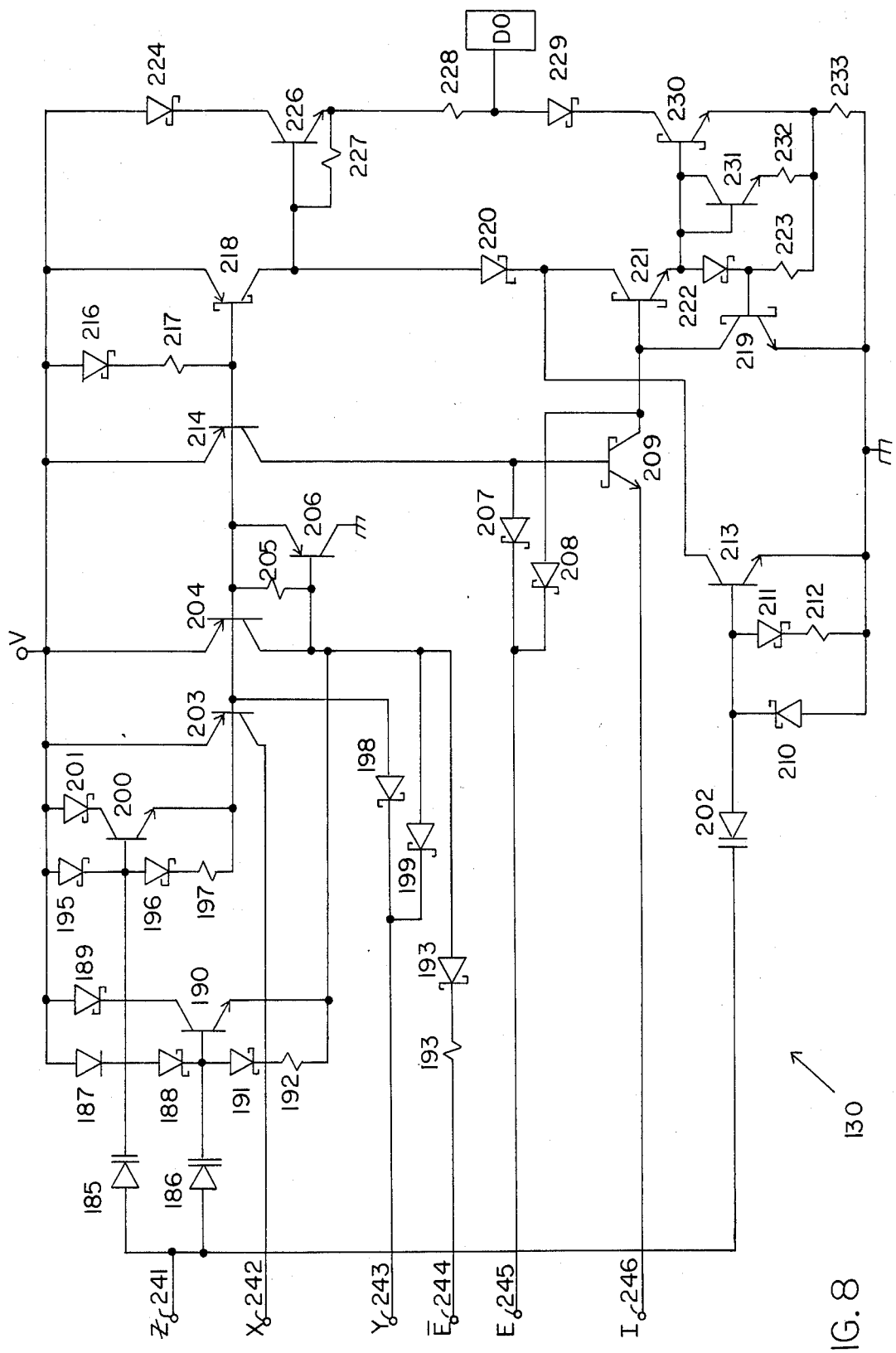
FIG. 8 is a schematic diagram of one embodiment of circuit 130 in FIG. 6.

FIG. 6 is a block diagram of a buffer circuit constructed in accordance with one embodiment of this invention. Input terminal DE receives an enable/disable input signal. When driver circuit 130 provides a high impedance output signal on output terminal DO, buffer circuit 100 is said to be "disabled". When driver circuit 130 provides either a logical 1 or logical 0 output signal on output terminal DO, buffer circuit 100 is said to be "enabled". When an enable input signal is received on input terminal DE, driver circuit 130 is enabled. When a disable input signal is received on input terminal DE, driver circuit 130 is disabled. Input terminal DI receives a data input signal. When the data input signal on input terminal DI is a logical 1 and driver circuit 30 is enabled, the output signal on output terminal DO is a logical 1. When the data input signal on input terminal DI is a logical 0 and driver circuit 130 is enabled, the output signal on output terminal DO is a logical 0.

One embodiment of driver input circuit 110 is shown in more detail in the schematic diagram of FIG. 7. Driver input circuit 110 provides a logical 1 I output signal on output lead 234 and a logical 0 $\bar{I}$ output signal on output lead 235 in response to a logical 1 input signal on input terminal DI. Conversely, driver input circuit 110 provides a logical 0 I output signal on output terminal 234 and a logical 1 $\bar{I}$ output signal on output terminal 235 when the input signal on input terminal DI is a logical 0. When a logical 1 input signal is placed on input terminal DI, PNP transistor 132 is turned off. Because transistor 132 is off, current flows from positive voltage source V through resistor 135, diode connected transistor 133, the base-emitter junction of NPN transistor 139, and resistor 140 to ground 116. Because transistor 139 is on, the voltage drop from the base of NPN transistor 138 to the emitter of NPN transistor 142 is not sufficient to turn on transistors 138 and 142. Also, because transistor 139 is on, the current flowing through resistor 140 is sufficient to create a voltage drop which forward biases the base-emitter junction of transistor 143. Therefore, transistor 143 is turned on and output terminal 235 provides a logical 0 $\bar{I}$ output signal. Because transistor 142 is off, output lead 234 provides a logical 1 I output signal equal in magnitude to the voltage drops across the diodes 145, 146, and 147. The logical 1 level of lead 234 is limited by diodes 145, 146 and 147 to to a voltage of approximately 2.0 volts so that the voltage on lead 234 does not swing too much above the turn-on threshold voltage of transistor 209 of driver circuit 130 in FIG. 8; this allows the I output signal to propagate faster from driver input circuit 110 to driver output circuit 130.

Conversely, when the input signal on input terminal DI is a logical 0, PNP transistor 132 is turned on and NPN transistor 139 is turned off. Because NPN transistor 139 is off, the voltage drop across resistor 140 is too small to forward bias NPN transistor 143 and therefore output lead 235 provides a logical 1 $\bar{I}$ output signal. Because transistor 139 is turned off NPN transistors 138 and 142 are forward biased and are therefore turned on. Because transistor 142 is turned on, output lead 234 provides a logical 0 I output signal.

One embodiment of driver output circuit 130 (FIG. 6) is shown in more detail in the schematic diagram of FIG. 8. Output lead 234 of driver input circuit 110 (FIGS. 6 and 7) is connected to input terminal 246 of FIG. 8. When input terminal 246 has a voltage level of logical 1 (i.e. the voltage drops of diodes 145, 146 and 147 of FIG. 7), and transistors 214 and 218 are on in response to an enable input signal provided on input terminal DE (FIG. 9), as explained below, the input signal on input terminal 246 forward biases the Schottky clamp diode of transistor 209, which in turn turns on NPN transistor 221. When NPN transistor 221 is turned on, current flows through PNP transistor 218, diode 220, and NPN transistor 221 to the base of NPN transistor 230, thereby turning on NPN transistor 230. Resistor 233 has a very small resistance value (approximately 2.75 ohms), thus the voltage drop across resistor 233 is very small. Therefore, the output signal provided on output terminal DO is a logical 0.

Conversely, when the input signal on input terminal 246 is a logical 0 and an enable input signal is applied to input terminal DE (FIG. 9), transistor 209 is forward biased and NPN transistor 221 is off. Therefore, current does not flow to the base of NPN transistor 230 and NPN transistor 230 is off. Current flows through PNP transistor 218 to the base of NPN transistor 226, turning on transistor 226. Resistor 228 has a very small resistance value (approximately 5.2 ohms); therefore, when transistor 226 is on, the output signal on output terminal DO is a logical 1.

With the embodiment shown in FIGS. 7 and 8, circuit 100 in FIG. 6 inverts and buffers the input signal provided on input terminal DI. If it is desired that the input signal should not be inverted, the metallization pattern of the integrated circuit which contains circuit 100 is changed so that output lead 235 (FIG. 7) is connected to input terminal 246 of FIG. 8 and the anode of diode 145 (FIG. 7) is connected to output lead 235 rather than output lead 234. If it is desired to provide differential output signals, two circuits such as circuit 130 are used, one providing an inverted output signal, the other providing a noninverted output signal.

Transistor 218 of FIG. 8 is a lateral PNP transistor. When PNP transistor 218 is off in response to a logical 0 enable input signal on enable input terminal DE (FIGS. 6 and 9), neither NPN transistor 226 or NPN transistor 230 is forward biased and thus output terminal DO provides a high impedance output state and is thus disabled. Conversely, when transistor 218 is on, output terminal DO is enabled and provides either a logical 1 or a logical 0 state depending upon the status of the input signal I on input terminal 246. Using prior art techniques for turning transistor 218 on and off, the transition from enable to disable states and vice versa is relatively slow (approximately 130 nanoseconds). This invention considerably quickens this transition.

Figure 9:
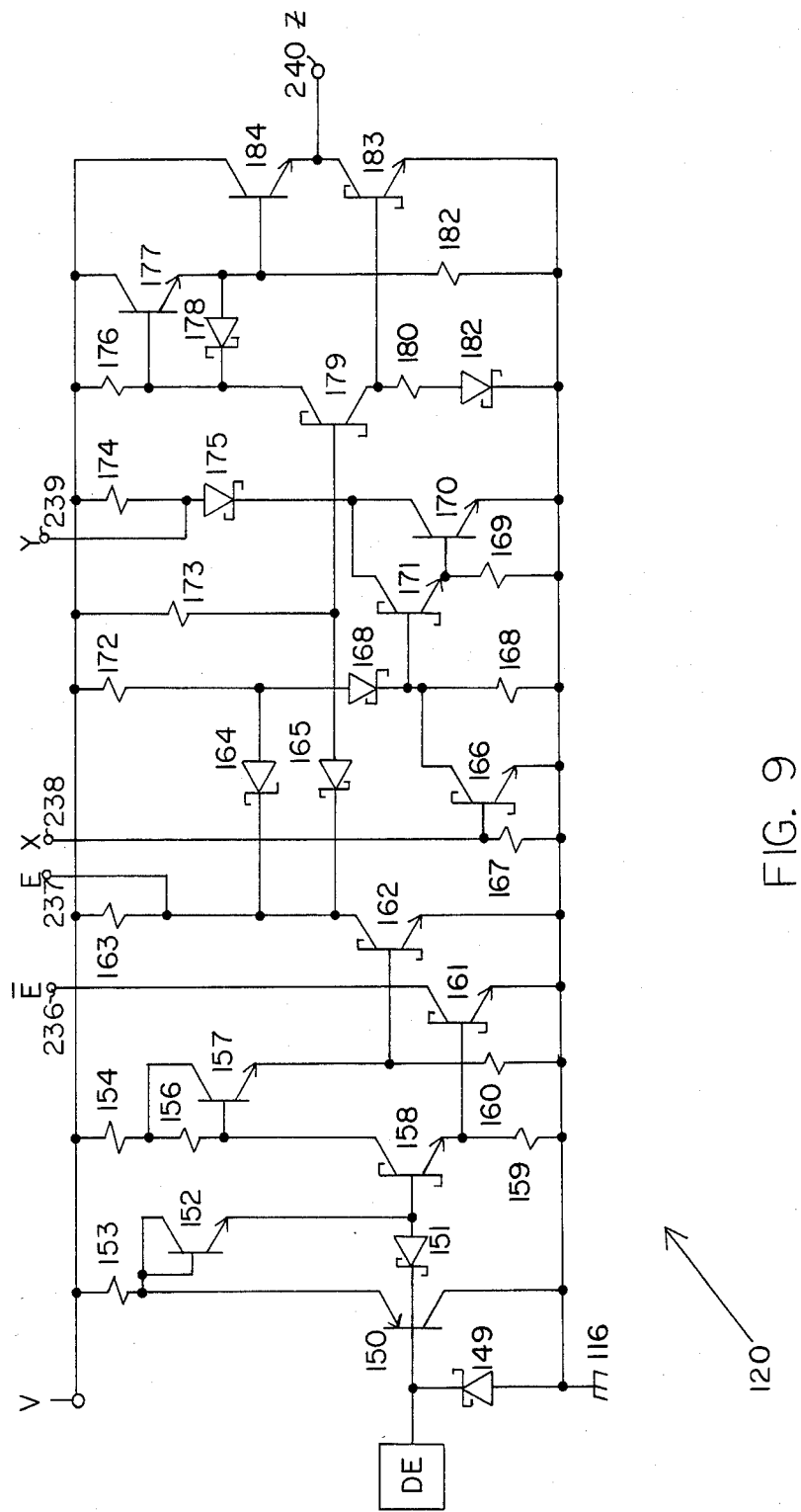
FIG. 9 is schematic diagram of one embodiment of circuit 120 in FIG. 6.

One embodiment of driver enable circuit 120 (FIG. 6) is shown in more detail in the schematic diagram of FIG. 9. Input terminal DE of FIG. 9 receives an enable/disable input signal. When the input signal on input terminal DE is a logical 1, the output signal $\bar{E}$ on output terminal 236 is a logical 0, output signal E on output terminal 237 is a logical 1, and output signal Y on output terminal 239 is a logical 0 until the current entering through input terminal 238 is large enough to turn on transistor 166; this happens when the collector currents of lateral PNP current source transistors 204, 214 and 218 in driver output circuit 130 of FIG. 8 reach a value large enough for the proper operation of driver output circuit 130, output signal Y on output terminal 239 then becomes a logical 1, and output signal Z on output terminal 240 is thus a logical 0. Conversely, when the input signal provided on input terminal DE is a logical 0, output signal $\overline{\text{E}}$ provided on output terminal 236 is a logical 1, output signal E provided on output terminal 237 is a logical 0, output signal Y provided on output terminal 239 is a logical 1, and output signal Z provided on output terminal 240 is a logical 1.

When the input signal on input terminal DE of FIG. 9 is a logical 1, PNP transistor 150 is off and NPN transistor 158 is on. When NPN transistor 158 is on, NPN transistor 161 is forward biased and therefore output signal $\overline{\text{E}}$ provided on output terminal 236 is a logical 0. When NPN transistor 158 is on, NPN transistors 157 and 162 are off and therefore output signal E provided on output terminal 237 is a logical 1. Because NPN transistor 162 is turned off, NPN transistor 179 is turned on. Therefore, NPN transistor 183 is forward biased and thus turned on, and NPN transistors 177 and 184 are off. Thus, output signal Z provided on output terminal 240 is a logical 0. Because NPN transistor 162 is off, current flows through resistor 172, through diode 168, through the base-emitter junction of the transistor 171, and through the base-emitter junction of transistor 170; therefore, transistors 171 and 170 are turned on, provided transistor 166 is not turned on by a positive current flow into input terminal 238. Therefore, output signal Y provided on output terminal 239 is a logical 0.

Conversely, when the input signal on input terminal DE of FIG. 9 is a logical 0, PNP transistor 150 is on and NPN transistor 158 is off. When NPN transistor 158 is off, NPN transistor 161 is not forward biased and therefore output signal $\overline{\text{E}}$ provided on output terminal 236 is a logical 1. When NPN transistor 158 is off, NPN transistors 157 and 162 are on and therefore signal E provided on output terminal 237 is a logical 0. Because NPN transistor 162 is turned on, transistor 179 is turned off. Therefore, NPN transistor 183 is not forward biased and thus turned off, and NPN transistors 177 and 184 are on. Thus, the output signal Z provided on output terminal 240 is a logical 1. Because NPN transistor 162 is on, current does not flow through resistor 172, through diode 168, through the base-emitter junction of the transistor 171, and through the base-emitter junction of transistor 170; therefore, transistors 171 and 170 are turned off. Therefore, output signal Y provided on output terminal 239 is a logical 1.

Lateral PNP transistors 203, 214 and 218 (FIG. 8) are configured as current mirrors; the current output of each transistor is equal to the collector current of lateral PNP transistor 204 multiplied by the ratio of the emitter areas of transistor 204 and the current source transistor in question. The collector current of lateral PNP transistor 204 is determined by the value of resistor 193. The collector of lateral PNP transistor 204 is at two base-emitter voltage drops (approximately 1.5 volts) below the supply voltage V. When output terminal 244 is at a logical 0 voltage level (about 0.2 volts above ground), the voltage drop across Schottky diode 194 is about 0.5 volts and the collector current of lateral PNP transistor 204 is approximately equal to the value (V−1.5−0.2−0.5)/R, where R is the value of resistor 193. The value of resistor 193 and the areas of transistors 203, 204, 214 and 218 are selected so that the collector currents of these transistors are at the correct values for proper circuit operation. The current source formed by PNP transistors 214 and 218 are necessary for forward biasing transistors 226 or 230. The current source formed by PNP transistor 203 functions as a current sensor whose output current tracks with the output currents of current source transistors 214 and 218. Thus, the current output of lateral PNP transistor 203 serves as a monitoring tool to determine when the currents of PNP transistors 214 and 218 have reached their proper values.

When the signal received on input terminal DE of FIG. 9 is a logical 1, input signal E provided on input terminal 245 of FIG. 8 is a logical 1 as previously explained. Therefore, diodes 207 and 208 are reverse biased and NPN transistors 209 and 221 operate as though diodes 207 and 208 were open switches. In addition, input signal $\overline{\text{E}}$ on input terminal 244 is a logical 0. Therefore, current flows through resistor 193, diode 194, resistor 205 and the base-emitter junctions of PNP transistors 203, 204, 206, 214, and 218, thus turning on these transistors. Because transistor 203 is turned on, current flows through transistor 203 to output terminal 242. Therefore, current flows into input terminal 238 (FIG. 9) and NPN transistor 166 is forward biased and is turned on. Because NPN transistor 166 is on, NPN transistors 171 and 170 of FIG. 9 are turned off and the output signal Y provided on output terminal 239 is a logical 1. Because the input signal Y on input terminal 243 of FIG. 8 is a logical 1, diodes 198 and 199 are reverse biased and therefore no current flows through diodes 198 and 199. Input signal Z provided on input terminal 241 is a logical 0 in response to the logical 1 input signal on input terminal DE. Therefore, a positive charge is stored on the cathodes of capacitor diodes 185 and 186, and capacitor diodes 185 and 186 are charged to voltages approximately equal to (V−1) volts and (V−1.5) volts respectively, where V is the supply voltage. Capacitor diode 202 has almost zero charge. Capacitor diodes are preferably used instead of simple capacitors because capacitor diodes are easier to construct in a bipolar integrated circuit. Because no current flows through capacitor diodes 185 and 186, NPN transistors 190 and 200 are off. Because PNP transistor 218 is on, driver output circuit 130 (FIGS. 6 and 8) is enabled and thus output buffer 100 of FIG. 6 is enabled.

Conversely, when the input signal received on input terminal DE of FIG. 9 is a logical 0, input signal E provided on input terminal 245 of FIG. 8 is logical 0 (as previously explained). Therefore, diodes 208 and 207 are forward biased and clamp the bases of transistors 209 and 221 to a logical 0. Therefore, transistors 209 and 221 are turned off. Input signal $\overline{\text{E}}$ provided on input terminal 244 is a logical 1. Therefore, diode 194 is reverse biased and no current flows through diode 194. Input signal Y provided on input terminal 243 is a logical 1. Therefore, diodes 198 and 199 are reverse biased. Because diodes 198, 199 and 194 are reverse biased no current flows through the base-emitter junctions of transistors 203, 204, 206, 214 and 218. Therefore, transistors 203, 204, 206, 214 and 218 are turned off. Input signal Z provided on input terminal 241 is a logical 1. Since the cathodes and the anodes of the capacitor diodes 185 and 186 are near the supply voltage, they have very little charge stored in them. The cathode of capacitor diode 202 is near the supply voltage while its anode is near ground; therefore, the cathode of capacitor diode 202 has a positive charge. Because transistor 218 is off, output buffer circuit 100 in FIG. 6 is disabled.

Output buffer circuit 100 in FIG. 6 is unique in that circuitry is provided to speed the transition from the enable to disable modes and vice versa. When output buffer circuit 100 of FIG. 6 changes from a disable to enable mode, input signal E received on input terminal 245 in FIG. 8 goes from a logical 0 to a logical 1, thereby reverse biasing diodes 207 and 208. Input signal $\overline{E}$ received on input terminal 244 goes from a logical 1 to a logical 0, thereby forward biasing diode 194 and drawing current through the base-emitter junctions of transistors 203, 204, 206, 214 and 218. This current is set by resistor 193, as explained earlier, to sustain the collector currents of PNP transistors 203, 204, 206, 214 and 218 at their desired steady state values. This current by itself is insufficient to rapidly turn on these transistors from their off states. If this current alone were allowed to turn on these transistors, approximately 150 nanoseconds would be required for the collector currents of these transistors to reach their steady state values; this would be a time delay far in excess of the time delays acceptable in modern high speed circuits. Such time delays result from the wide base regions (and hence low bandwidths) and low current gains (because of low emitter and collector efficiencies and high recombination in the base region) of lateral PNP transistors; a large amount of electron charge must be stored in the base region of the PNP transistor before its collector current can be increased. To effect rapid turn on of the lateral PNP transistors, an additional current path is provided, as described below, to provide a large current transient when the circuit is enabled; this current transient rapidly increases the stored base charge of the lateral PNP transistors and bring their collector currents up to the desired values in approximately 20 nanoseconds.

During the transition from a disable mode to an enable mode, input signal Y provided on input terminal 243 goes to a logical 0. Therefore, current flows from positive voltage source V, through the base-emitter junctions of transistors 203, 204, 206, 214 and 218, through diodes 198 and 199, through diode 175 of FIG. 9, and through NPN transistors 171 and 170 to ground 116. Because there are no resistances in this current path (other than parasitic resistances), the current flowing through this path is very large (approximately 40 milliamperes). This large current turns on transistor 218 very fast, within approximately 20 nanoseconds. The current through transistor 203 is proportional to the current through the other lateral PNP transistors 204, 214, and 218 and the collector currents of these transistors increase simultaneously. The collector current of transistor 203 creates a voltage drop across resistor 167 in FIG. 9. When the collector currents of lateral PNP transistors 214 and 218 reach the values for proper circuit operation, the collector current of transistor 203 is of such magnitude that the voltage drop across resistor 167 is sufficient to foward bias NPN transistor 166, causing NPN transistor 166 to turn on and clamp the base of transistor 171 to ground 116. Therefore, NPN transistors 171 and 170 turn off and output signal Y provided on output terminal 239 switches from a logical 0 to a logical 1. Because input signal Y at input terminal 243 of FIG. 8 is now a logical 1, diodes 198 and 199 are reverse biased and no current flows through diodes 198 and 199. The current flowing through resistor 193, diode 194 of FIG. 8, and transistor 161 of FIG. 9 is sufficient to maintain transistors 203, 204, 206, 214 and 218 in the on state. The very large current which flows through input terminal 243 would be sufficient to damage transistors 203, 204, 206, 214 and 218 if it were maintained; however, transistors 170 and 171 of FIG. 9 turn off this very large current after the advantage of fast turn on time of transistor 218 (FIG. 8) has been achieved but before damage occurs. In other embodiments of this invention, it may be desirable to limit the current through input terminal 243 in order to avoid over saturation of transistor 218 in case its collector current significantly overshoots the desired steady value. In this case, an additional resistor is provided between input terminal 243 and diodes 198 and 199.

When output buffer circuit 100 of FIG. 6 goes from an enable state to a disable state, input signal Z on input terminal 241 goes rapidly from a logical 0 to a logical 1. Since capacitors 185, 186, and 202 cannot instantaneously change the voltage across their terminals, the other side of the capacitors follow the voltage transient on terminal 241. This causes capacitor diodes 185 and 186 to discharge into the bases of transistors 200 and 190, respectively, while the charging of capacitor diode 202 provides current to the base of transistor 213. Therefore, transistors 190, 200 and 213 are turned on hard during the voltage transient caused by the logical 0 to logical 1 transistion of input signal Z. The bases transistors 203, 204, 206, 214 and 218 are clipped to positive voltage source V by transistors 190 and 200 and the large current provided by transistors 190 and 200 neutralize the excess electrons in the base regions of all the PNP transistors. Thus transistors 203, 204, 206, 214 and 218 quickly turn off. To ensure that transistors 226 and 230 will turn off immediately, transistor 213 is turned on while capacitor diode 202 is charging up. Transistor 213 shunts to ground any current which may flow through transistor 218 before transistor 218 turns completely off.

The circuit formed by transistors 209, 219, 221, 231, 230, 224, 214, 218 and resistors 223, 232 and 233, and diode 222 is a transition time control circuit which is described in co-pending U.S. patent application Ser. No. 623,692 which is assigned to National Semiconductor Corporation, the assignee of this application and is hereby incorporated by reference.

While this specification illustrates specific embodiments of this invention, it is not to be interpreted as limiting the scope of the invention. Many embodiments of this invention will become evident to those of ordinary skill in the art in light of the teachings of this specification.

We claim:

1. An output buffer having a data input terminal, an enable input terminal and an output terminal, comprising:
   a first bipolar transistor of a first doping configuration having a collector, an emitter connected to a first potential and a base;
   a high current source having a high current output lead connected to said base of said first bipolar transistor and having a first control input lead, said high current source providing a high current in response to signals provided on said first control input lead;
   a low current source having a low current output lead connected to said base of said first bipolar transistor, and having a second control input lead, said low current source providing current in response to signals provided on said second control input lead;

current sensing means for sensing the collector current in said first bipolar transistor, said current sensing means having a first control output lead connected to said first control input lead, a second control output lead connected to said second control input lead, and a master control input lead connected to said enable input terminal, said current sensing means providing a first set of output signals on said first and second control output leads in response to a first input signal provided on said master control input terminal and a first selected current in said first bipolar transistor thereby causing said high current source and said current source to provide current, thereby causing said first bipolar transistor to turn on quickly, said current sensing means providing a second set of output signals on said first and second control output leads in response to said first input signal on said master control input lead and a second selected current in said first bipolar transistor thereby causing said high current source to not provide current and said low current source to provide current thereby causing said first bipolar transistor to remain on, and said current sensing means providing a third set of output signals on said first and second control output leads in respnse to a second input signal on said master control input lead thereby causing said high current source and said low current source to not provide current and causing said first bipolar transistor to turn off;

a second bipolar transistor of a second doping configuration opposite to said first doping configuration having a collector connected to said first potential, a base connected to said collector of said first bipolar transistor and an emitter connected to said output terminal;

a third bipolar transistor of said second doping configuration having a collector connected to said collector of said first bipolar transistor, a base connected to said data input terminal, and having an emitter;

a fourth bipolar transistor of said second doping configuration having a collector connected to said output terminal, a base connected to said emitter of said third bipolar transistor, and an emitter connected to a reference potential;

first switching means having a first current handling terminal connected to said base of said first bipolar transistor, a second current handling terminal connected to said emitter of said first bipolar transistor, and having a control terminal; and first bias pulse means having an input lead connected to said enable input terminal, and a pulse output lead connected to said control terminal of said first switch means for providing a bias pulse to said control terminal of said first switch means in respnse to said second input signal of said enable input terminal thereby causing said first bipolar transistor to turn off quickly.

2. An output buffer as in claim 1 wherein said first switch means comprises a transistor.

3. An output buffer as in claim 1 wherein said first bipolar transistor is a lateral PNP transistor.

4. An output buffer as in claim 1 wherein said first bipolar transistor is a lateral PNP transistor.

5. An output buffer as in claim 1 further comprising:
second switch means having a first current handling terminal connected to said reference potential, a second current handling terminal connected to said collector of said first bipolar transistor, and having a control terminal; and second bias pulse means having an input lead connected to said enable input terminal, and a pulse output lead connected to said control terminal of said second switch means for providing a bias pulse to said control terminal of said second switch means in response to said second input signal on said enable input terminal, thereby causing said fourth transistor to turn off quickly.

6. An output buffer as in claim 5 wherein said switch means comprises a transistor.

* * * * *